(12) United States Patent
Wu et al.

(10) Patent No.: US 9,224,864 B1
(45) Date of Patent: Dec. 29, 2015

(54) SEMICONDUCTOR DEVICE AND METHOD OF FABRICATING THE SAME

(71) Applicant: UNITED MICROELECTRONICS CORP., Hsin-Chu (TW)

(72) Inventors: Yen-Liang Wu, Taipei (TW); Chung-Fu Chang, Tainan (TW); Yu-Hsiang Hung, Tainan (TW); Wen-Jiun Shen, Yunlin County (TW); Ssu-I Fu, Kaohsiung (TW); Man-Ling Lu, Taoyuan County (TW); Chia-Jong Liu, Ping-Tung County (TW); Yi-Wei Chen, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/463,676

(22) Filed: Aug. 20, 2014

(30) Foreign Application Priority Data

Jul. 16, 2014 (CN) .......................... 2014 1 0337946

(51) Int. Cl.
| H01L 21/00 | (2006.01) |
| H01L 21/84 | (2006.01) |
| H01L 29/78 | (2006.01) |
| H01L 29/66 | (2006.01) |

(52) U.S. Cl.
CPC ...... *H01L 29/7848* (2013.01); *H01L 29/66795* (2013.01); *H01L 29/785* (2013.01)

(58) Field of Classification Search
CPC .................................................. H01L 29/66818
See application file for complete search history.

(56) References Cited

U.S. PATENT DOCUMENTS

| 8,211,772 | B2 | | 7/2012 | Kavalieros |
| 8,377,779 | B1 | * | 2/2013 | Wang .............................. 438/283 |
| 8,623,728 | B2 | | 1/2014 | Chang |
| 2004/0157353 | A1 | * | 8/2004 | Ouyang et al. .................. 438/38 |
| 2007/0238273 | A1 | * | 10/2007 | Doyle et al. .................. 438/525 |
| 2013/0244396 | A1 | * | 9/2013 | Oh et al. ....................... 438/400 |
| 2015/0061015 | A1 | * | 3/2015 | He et al. ....................... 257/347 |

* cited by examiner

*Primary Examiner* — Angel Roman
(74) *Attorney, Agent, or Firm* — Winston Hsu; Scott Margo (57) ABSTRACT

A semiconductor device includes a fin structure, an insulating structure, a protruding structure, an epitaxial structure, and a gate structure. The fin structure and the insulating structure are disposed on the substrate. The protruding structure is in direct contact with the substrate and partially protrudes from the insulating structure, and the protruding structure is the fin structure. The epitaxial structure is disposed on a top surface of the fin structure and completely covers the top surface of the fin structure. In addition, the epitaxial structure has a curved top surface. The gate structure covers the fin structure and the epitaxial structure.

19 Claims, 6 Drawing Sheets

SEMICONDUCTOR DEVICE AND METHOD OF FABRICATING THE SAME

BACKGROUND OF THE INVENTION

1. Field of the Invention

The present invention relates generally to the field of a semiconductor device, and more particularly to a non-planar semiconductor device with fin structures and a fabrication method thereof.

2. Description of the Prior Art

With the trend in the industry of scaling down the size of metal oxide semiconductor transistors (MOS), three-dimensional or non-planar transistor technology such as fin field effect transistor technology (Fin FET) has been developed to replace planar MOS transistors. The three-dimensional structure of a fin FET increases the overlapping area between the gate and the fin-shaped structure of the silicon substrate, so that the channel region is more effectively controlled. The drain-induced barrier lowering (DIBL) effect and short channel effect (SCE) are therefore reduced. The channel region is also longer under the same gate length, which increases the current between the source and the drain.

In order to further improve the device's performance, a strained-silicon technology has also been developed. The main principle is that strains are applied to predetermined regions within the semiconductor device, which in turn make the semiconductor device work better by enabling charge carriers, such as electrons or holes, to pass through the lattice of the channel more easily. One main technology disposes epitaxial structures with lattice constants different from that of the crystal silicon in the source/drain regions of the semiconductor devices. The epitaxial structures are preferably composed of silicon germanium (SiGe) or carbon-doped silicon (SiC), which have lattice constants different from that of the crystal silicon. Since the epitaxial structures have lattice constants which are larger or smaller than that of the crystal silicon, carrier channel regions adjacent to the epitaxial structures can sense external stress, and both the lattice structure and the band structure within these regions are thereby altered. As a result, the carrier mobility and the performances of the corresponding semiconductor devices are improved.

With the continued decrease in the size and dimensions of semiconductor devices, however, there are newly generated technological problems that need to be overcome, even with the adoption of the non-planar transistor with raised source/drain regions. How to effectively eliminate these defects and improve the performance of the semiconductor devices are important issues in this field.

SUMMARY OF THE INVENTION

In light of the above, the embodiments of the present invention disclose a semiconductor device and a method for fabrication to overcome the above-mentioned drawbacks.

A semiconductor device is disclosed according to one embodiment of the present invention. The semiconductor device comprises a fin structure, an insulating structure, a protruding structure, an epitaxial structure, and a gate structure. The fin structure and the insulating structure are disposed on the substrate. The protruding structure is in direct contact with the substrate and partially protrudes from the insulating structure, wherein the protruding structure is the fin structure. The epitaxial structure is disposed on a top surface of the fin structure and completely covers the top surface of the fin structure. In addition, the epitaxial structure has a curved top surface. The gate structure covers the fin structure and the epitaxial structure.

A method for fabricating a semiconductor device is disclosed according to another embodiment of the present invention. The method may be applied to a semi-finished semiconductor device comprising a substrate, a fin structure, and an insulating structure. Both the fin structure and the insulating structure are disposed on the substrate. The method comprises the following steps: etching a top surface of the fin structure; and growing an epitaxial layer with a curved top surface merely on the top surface of the fin structure after the step of etching the top surface of the fin structure.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are given to provide a thorough understanding of the invention. It will, however, be apparent to one of ordinary skill in the art that the invention may be practiced without these specific details. Furthermore, some well-known system configurations and process steps are not disclosed in detail.

The drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 1:
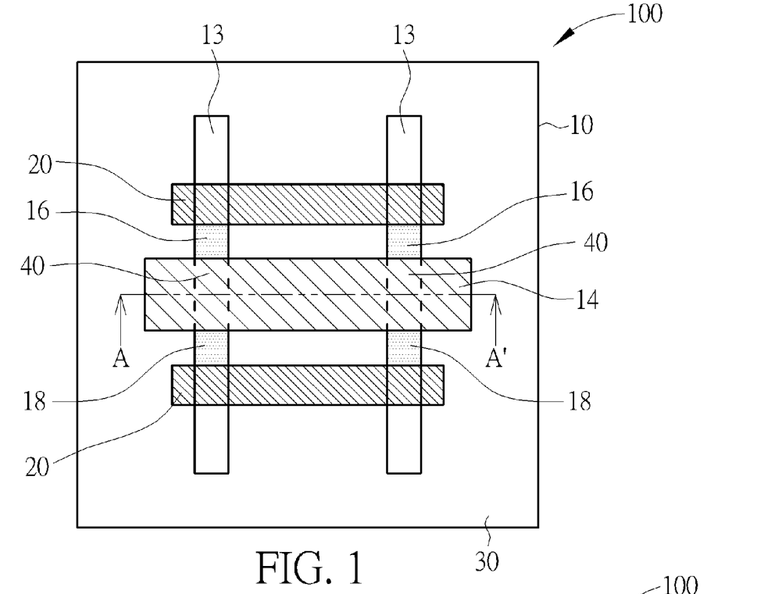
FIG. 1 is a schematic diagram showing a portion of a semiconductor device according to a first embodiment of the present invention.

FIG. 1 is a schematic top-view showing a portion of a semiconductor device 100 according to one embodiment of the present invention. The semiconductor device 100 includes at least a substrate 10, at least two fin structure 13 disposed on the substrate 10, epitaxial structures 40 disposed on a top surface of each of the fin structures 13, source regions 16, drain regions 18 and at least two metal contact structures respectively electrically connected to the source regions 16 and the drain regions 18.

The substrate 10 may have a main surface 10a with a predetermined crystal surface, and the long axis of the fin structure 13 is parallel to a predetermined crystal orientation.

For example, for a bulk silicon substrate, the main surface 10a as well as the top surfaces of the fin structures 13 may all have specific crystal surfaces, such as (100) crystal surfaces, and the long axis of the fin structures 13 may be parallel to a specific crystal orientation, such a ⟨110⟩ crystal orientation, but is not limited thereto. The gate structure 14 may cross over the fin structures 40 and the epitaxial structures 40 so that the source regions 16 and the drain regions 18 may be respectively disposed on either side of the gate structure 14. For example, the source/drain regions may be disposed inside the epitaxial structures 40 on two sides of the gate structure 14 or inside other epitaxial structures overlaying the epitaxial structures 40. The metal contact structures 20, respectively electrically connected to the source regions 16 and the drain regions 18, may be used as a current passage between the source regions 16 and the drain regions 18. In addition, an optional metal contact structure electrically connected to the gate structure 14 may be used to receive an external voltage, which is used to turn on or turn off the carrier channel beneath the gate structure 14.

Figure 2:
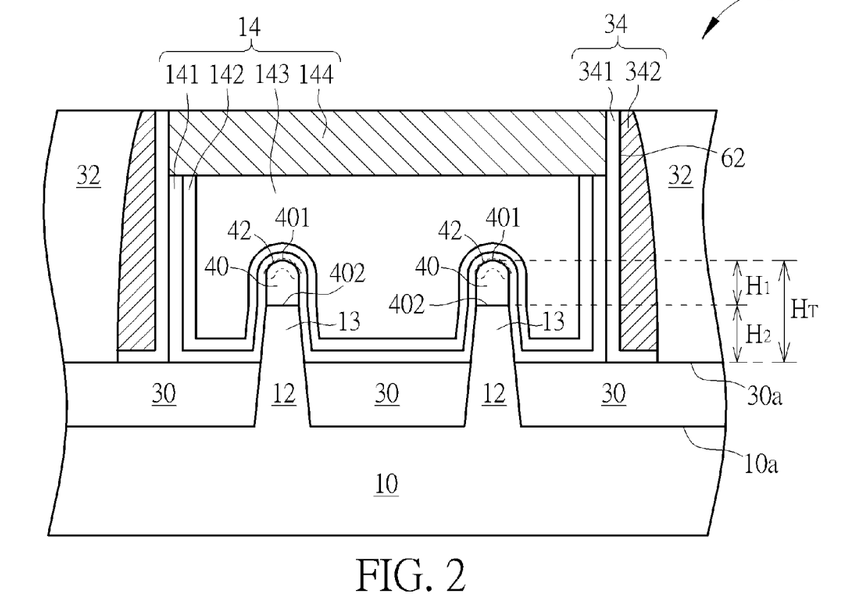
FIG. 2 is a cross-sectional diagram taken along a section line in FIG. 1 according to a first embodiment of the present invention.

FIG. 2 is a cross-sectional diagram taken along a section line in FIG. 1 according to a first embodiment of the present invention. The epitaxial structure 40 has a gradually reduced width from bottom to top and has a curved top surface 401. Preferably, the composition of the epitaxial structure 40 is different from that of the underneath fin structure 13, e.g. they preferably have different lattice constants. For example, in a case where the epitaxial structures 40 are disposed in a P-type field effect transistor, the lattice constant of the epitaxial structure 40 is preferably greater than that of the fin structure 13. Specifically, when the main composition of the fin structures are silicon, the composition of the epitaxial structures 40 may be silicon germanium ($Si_{1-x}Ge_x$, $X \leq 1$). Optionally, the germanium concentration inside the epitaxial structure 40 increases from the bottom to the top of the epitaxial structure 40 or increases from the inside to the outside of the epitaxial structure 40, but is not limited thereto. When the epitaxial structure 40 is disposed in an N-type field effect transistor, the lattice constant of the epitaxial structure 40 is preferably less than that of the fin structure 13. Specifically, when the main composition of the fin structures are silicon, the composition of the epitaxial structures 40 may be silicon carbide ($Si_{1-x}C_x$, $X<1$), silicon phosphorous (SiP), or other suitable materials. Optionally, the carbon concentration inside the epitaxial structure 40 may increase from the bottom to the top of the epitaxial structure 40 or increase from the inside to the outside of the epitaxial structure 40, but is not limited thereto.

One feature of the present embodiment is that, when the semiconductor device 100 is in an on-state, an overlapped region in the epitaxial structures and between the epitaxial structures and the gate structure 14 may be used as a main current path. Because of the curved top surface 401 of the epitaxial structure 14, the electric field induced by the gate structure may be uniformly distributed on the curved top surface 401. In this way, the electric field may not be accumulated in a certain region of the epitaxial structures 40, and the electrical properties of the semiconductor device 100 may be enhanced. In addition, because the epitaxial structures 40 with the curved top surface 401 replace top portions of the original fin structures, a widened carrier channel may be obtained compared with a semiconductor device without the epitaxial structures 40 with the curved top surface. Furthermore, because the lattice constant of the epitaxial structures 40 differ from that of the underneath fin structures, the epitaxial structures 40 disclosed in this embodiment may also provide a carrier channel with better carrier mobility compared with fin structures without the epitaxial structures.

The structure of the semiconductor device shown in FIG. 2 is described in the following paragraphs in detail. The semiconductor device 100 further includes protruding structures 12 and an insulating structure 30. The protruding structures 12 directly contact the substrate 10 and protrude from the main surface 10a of the substrate 10. The insulating structure 30 may be a shallow trench insulating structure surrounding the lower portion of the protruding structures 12. The upper portion of the protruding structure 12 may protrude from the top surface of the insulating structure 30 and may be regarded as fin structures 13. The epitaxial structures 40 may directly contact with and completely cover the top surface of the fin structure 13. Preferably, the interface between the epitaxial structure 40 and fin structure 13 is a flat interface 402.

The gate structure 14 is disposed in the dielectric layer 32 and the lateral boundaries of the gate structure 14 are defined by spacers 34. In detail, the gate structure 14 is a metal gate structure which includes at least a gate dielectric 141, a work function layer 142, a gate electrode 143, and an optional cap layer 144 sequentially stacked from bottom to top. The gate dielectric 141 conformally covers both the fin structures 13 and the epitaxial structures 40, and the cap layer 144 concurrently covers the gate dielectric 141, the work function layer 142 and the gate electrode 143.

Each of the spacers 34 may have a single-layered structure or have a double or multi-layered structure. For example, the spacer 34 may be a double-layered structure which includes an L-shaped lower spacer 341 and an upper spacer 342 sequentially stacked from its bottom to its top. The gate dielectric 141 is preferably a high-k dielectric layer with a dielectric constant substantially greater than 20. As an example, the gate dielectric 141 may be selected from the group consisting of hafnium oxide ($HfO_2$), hafnium silicon oxide ($HfSiO_4$), hafnium silicon oxynitride (HfSiON), aluminum oxide ($Al2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), but is not limited thereto. The gate electrode 143 may include metal or metal oxide with superior filling ability and relatively low resistance, such as aluminum (Al), titanium aluminum (TiAl), titanium aluminum oxide (TiAlO), tungsten (W) or copper (Cu), but is not limited thereto. The cap layer 144 may be made of silicon nitride, silicon carbide, silicon oxynitride, silicon carbon nitride, and/or other suitable materials. The cap layer 144 may prevent a self-aligned contact formed in the following processes from electrically connecting to the gate electrode 143.

When the carrier channel of the semiconductor device 100 is switched to an on-state, the carriers may mainly flow between the source region 16 and the drain region 18 via a main current path 42 in an upper portion of the epitaxial structure 40. Because most of the carriers move via the main current path 42, the current density of the upper epitaxial structure 40 may be higher than that of the lower epitaxial structure 40. Even if the entire height of the epitaxial structure 13 is not high enough, the electrical properties of the semiconductor device 100 may still be good. For instance, the height $H_1$ of the epitaxial structure 40 may be less than the height $H_2$ of the fin structure 13. In a case where the fin structure 13 and the epitaxial structure 40 have a total height $H_T$, the ratio of the height $H_1$ of the epitaxial structure 40 to the total height $H_T$ is preferably less than 0.5. In addition, because the epitaxial structure 40 and the gate dielectric 141 together include three contact surfaces, the semiconductor device 100 may also be called a tri-gate MOSFET.

Figure 3:
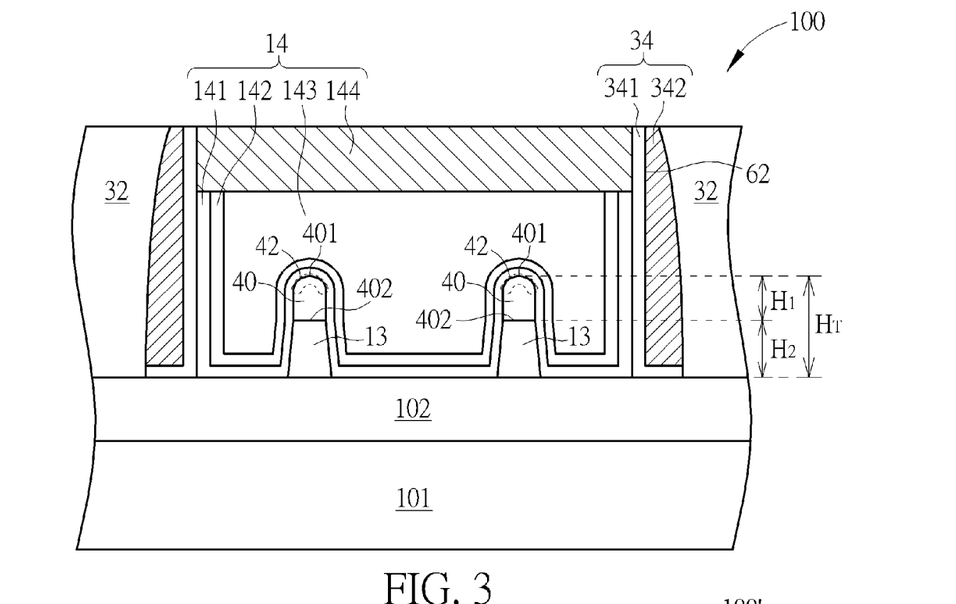
FIG. 3 is a cross-sectional diagram taken along a section line in FIG. 1 according to a first embodiment of the present invention.

As mentioned above, the substrate 10 may be a bulk silicon substrate. Therefore, the protruding contour of the protruding structures 13 may be formed by etching the silicon substrate. The substrate 10 may also be chosen from other substrates, such as a silicon-on-insulator (SOI) substrate, and the semiconductor device 100 using the SOI substrate is shown in FIG. 3. Specifically, the SOI substrate may include a lower substrate 101, an insulating structure 102 and a silicon-containing layer stacked from bottom to top. Because the fin structures 13 may be formed by etching the silicon-containing layer, an insulating structure 102 may be interposed between the lower substrate 101 and the fin structures 13 to prevent the lower substrate 101 from contacting with the fin structures 13. Apart from the position of the fin structure, insulating structure and lower substrate, the remaining parts of the semiconductor device disclosed in this embodiment are similar to those shown in the semiconductor device of the previous first preferred embodiment, and are therefore not disclosed in detail.

In addition to the bulk silicon substrate and the silicon-on-insulator (SOI) substrate disclosed in the first and second embodiments, the substrate may also be chosen from a silicon containing substrate, a III-V group-on-silicon (such as GaN-on-silicon) substrate, a graphene-on-silicon substrate and a silicon-on-insulator (SOI) substrate, but is not limited thereto.

Figure 4:
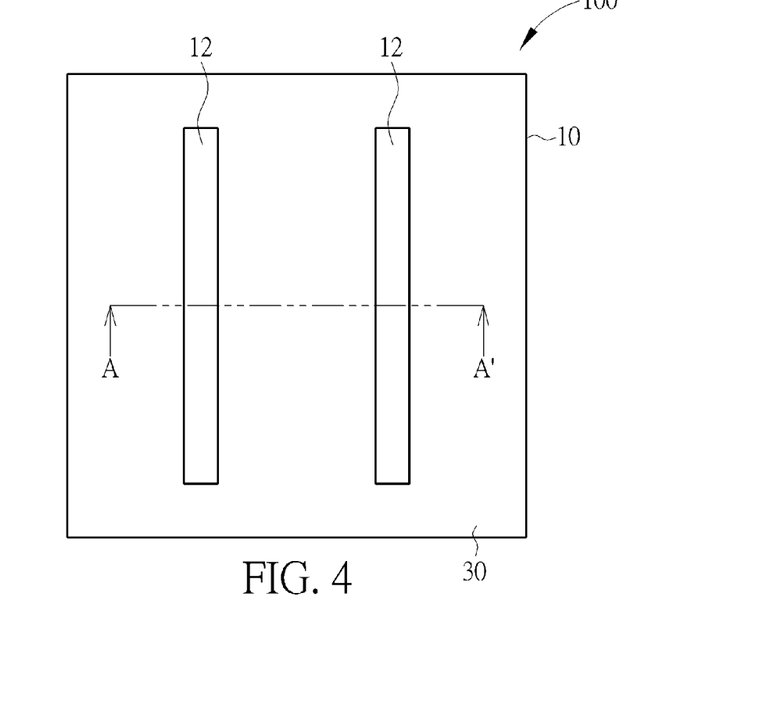
FIG. 4 to FIG. 7 are cross-sectional diagrams showing a method for fabricating a semiconductor device according to one embodiment of the present invention.

A method for fabricating the semiconductor device above is disclosed in the following paragraphs. FIG. 4 is a schematic diagram showing a portion of the semiconductor device at the beginning of a fabrication process. At this processing stage, the semi-finished semiconductor device 100' includes at least a substrate 10, at least two protruding structures 12, and an insulating structure 30. Both the protruding structures 12 and the insulating structure 30 are disposed on the substrate 10. According to the first embodiment, because the insulating structure 30 is a shallow trench insulating structure, it may surround the lower portion of the protruding structures 12.

Figure 5:
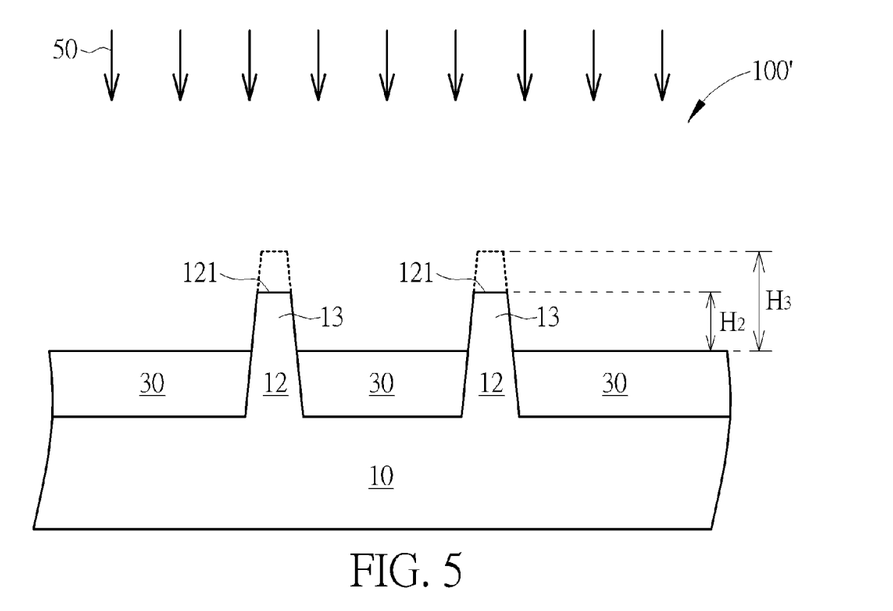

FIG. 5 is a cross-sectional diagram taken along a section line A-A' in FIG. 4 and showing the semiconductor device after the step of etching the fin structures. An etching process 50 may be performed to reduce the height of the top surface 121 of the fin structure 13. For example, the top surface 121 may be etched until its height is reduced from the initial height $H_3$ to a reduced height $H_4$. Preferably, the ratio of the reduced height $H_4$ to the initial height $H_3$ is greater than 0.5.

Figure 6:
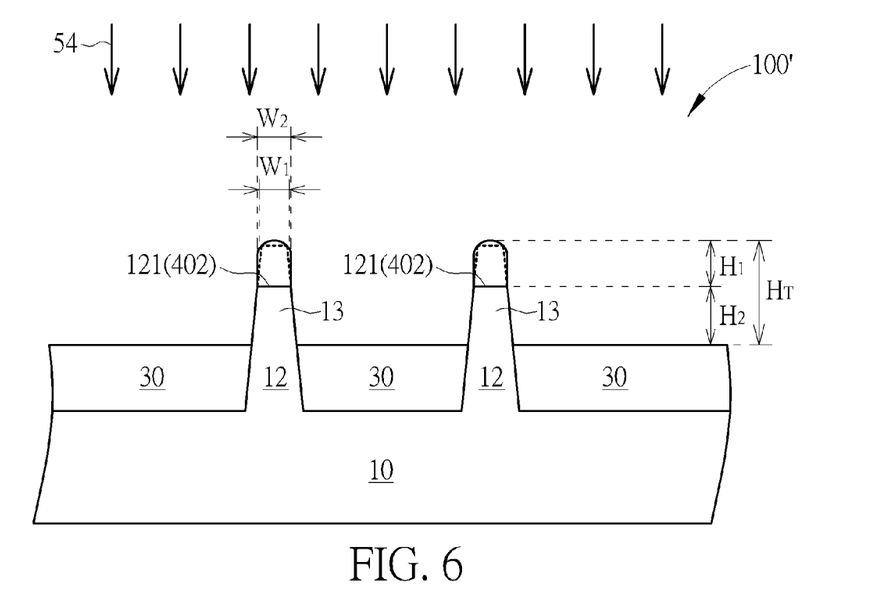

FIG. 6 is a schematic cross-sectional diagram showing the semiconductor device after the step of performing an epitaxial growth process. An epitaxial growth process 54 such as a molecular beam epitaxial growth process, a co-flow epitaxial growth process, acyclic selective epitaxial growth process and/or other suitable epitaxial growth processes may be carried out to grow epitaxial structures 40 on the top surface 121 of the fin structure 13. A flat interface 402 exists between the epitaxial structure 40 and the fin structure 13. According to this embodiment, because the top surface 121 of the fin structure 13 has a specific crystal surface (for example, a (100) crystal surface), the epitaxial structure 40 may grow faster on the top surface 121 than on the sidewall of the fin structure. If etchants capable of etching the epitaxial structure are intermittently applied to the chamber during the epitaxial growth process, these etchants may remove the epitaxial structure on the sidewall of the fin structures completely so that the epitaxial structure on the top surface of the fin structure remains. Preferably, the epitaxial structure 40 has a width gradually reduced from bottom to top and has a curved top surface 401. In detail, the middle region of the epitaxial structure 40 may have a width $W_2$ wider than the width $W_1$ of the middle region of the original fin structure (corresponding to the wedge-shaped dotted line shown in FIG. 6). The epitaxial structure 40 may provide a wider carrier channel than the original fin structure. In addition, the position of the apex of the top surface 401 may be used as a basis for determining the end point of the epitaxial growth process 54. For example, when the epitaxial growth process 54 is completed, the apex of the top surface 401 may be at an original height of the top surface of the fin structure before the etching process. The apex of the top surface 401 may be at an initial height $H_3$ at this processing stage, and the height $H_1$ of the epitaxial structure 40 itself may be less than the height $H_2$ of the fin structure 13. In other words, in a case where the fin structure 13 and epitaxial structure 40 have a total height, the ratio of the height $H_1$ of the epitaxial structure 40 to the total height $H_T$ is preferably less than 0.5.

Figure 7:
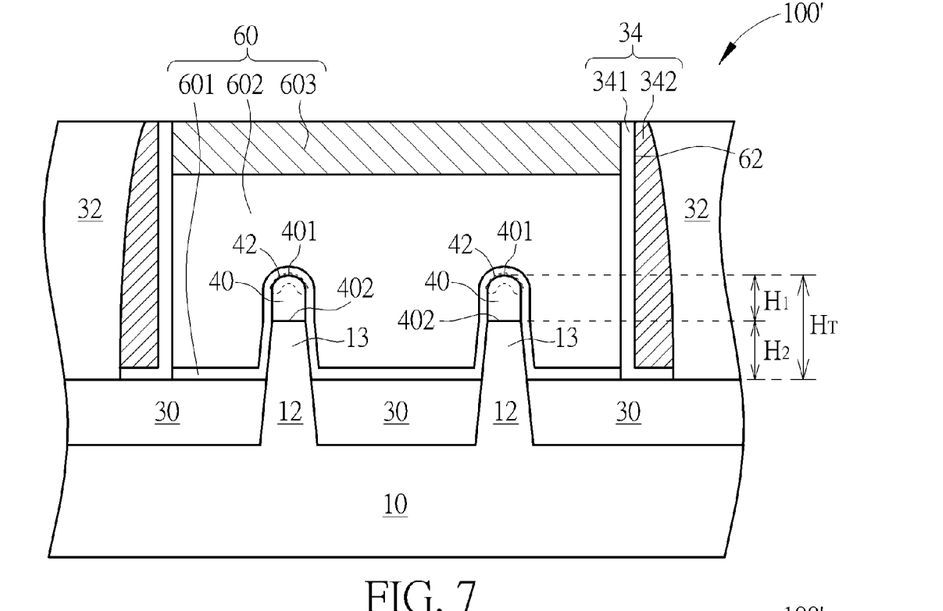

FIG. 7 is a cross-sectional diagram showing a semi-finished semiconductor device after the step of forming a dummy gate structure. A dummy gate structure 60 is formed on the substrate 10 to cross and cover adjacent two fin structures 13 and the epitaxial structures 40. For example, the dummy gate structure 60 may include a gate dielectric 601, a dummy gate electrode 602 and a cap layer 603 sequentially stacked from bottom to top. A deposition process and an etching process are performed sequentially to form spacers 34 on the sidewalls of the dummy gate structure 60. Optionally, additional epitaxial structures may be further formed on the fin structure 13 exposed by the dummy gate structure 60 through performing another epitaxial growth process. These additional epitaxial structures may apply compressive stress or tensile stress to the adjacent channel region to increase the carrier mobility. Afterwards, through a deposition process and a planarization process, a dielectric layer 32 surrounding the dummy gate structure 60 and the spacer 34 may be formed. In the following processes, a replacement metal gate process may be carried out to replace the dummy gate structure 60 with the metal gate structure shown in FIG. 2. Then, after the replacement metal gate process, an optional inter-metal dielectric layer and an optional self-aligned contact etc. may be further formed to obtain the desired semiconductor device.

In the preceding paragraphs, the step of performing the epitaxial growth process is performed prior to the step of forming the dummy gate structure. In another embodiment, however, the step of performing the epitaxial growth process may also be performed later than the step of forming the dummy gate structure. This embodiment is disclosed in the following paragraphs.

Figure 8:
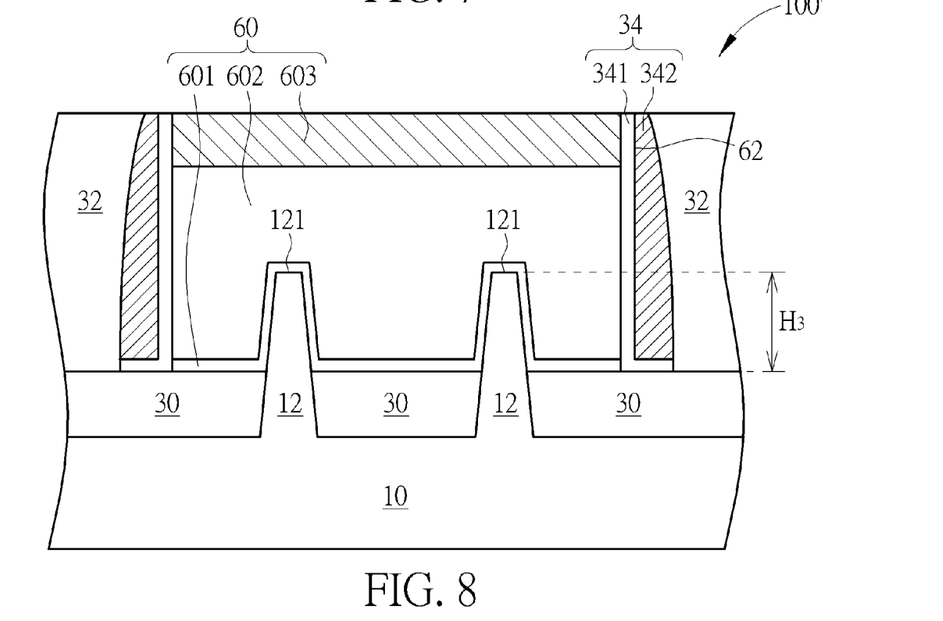
FIG. 8 to FIG. 10 are cross-sectional diagrams showing a method for fabricating a semiconductor device according to another embodiment of the present invention.

FIG. 8 is a schematic diagram showing a method for fabricating the semiconductor device according to a second embodiment of the present invention. Subsequent to the stage in FIG. 4, a step of forming a dummy gate structure 60 on the substrate rather than the etching process shown in FIG. 5 is performed. As shown in FIG. 8, the dummy gate structure 60 may cross and cover the adjacent two fin structures 13 and may include a gate dielectric 601, a dummy gate electrode 602 and a cap layer 603 sequentially stacked from bottom to top. It should be noted that the top surface 121 of the fin structure 13 may be substantially kept at its initial height $H_3$ at this time because no etching process is applied to etch the top surface 121 of the fin structure 13 before the formation of the dummy gate structure 60.

As in the previous embodiment, additional epitaxial structures may be further formed on the fin structure 13 exposed by the dummy gate structure 60 by performing an epitaxial growth process. These additional epitaxial structures may apply compressive stress or tensile stress to the adjacent channel region to increase the carrier mobility. Afterwards, through a deposition process and a planarization process, a dielectric layer 32 surrounding the dummy gate structure 60 and the spacer 34 may be formed.

Figure 9:
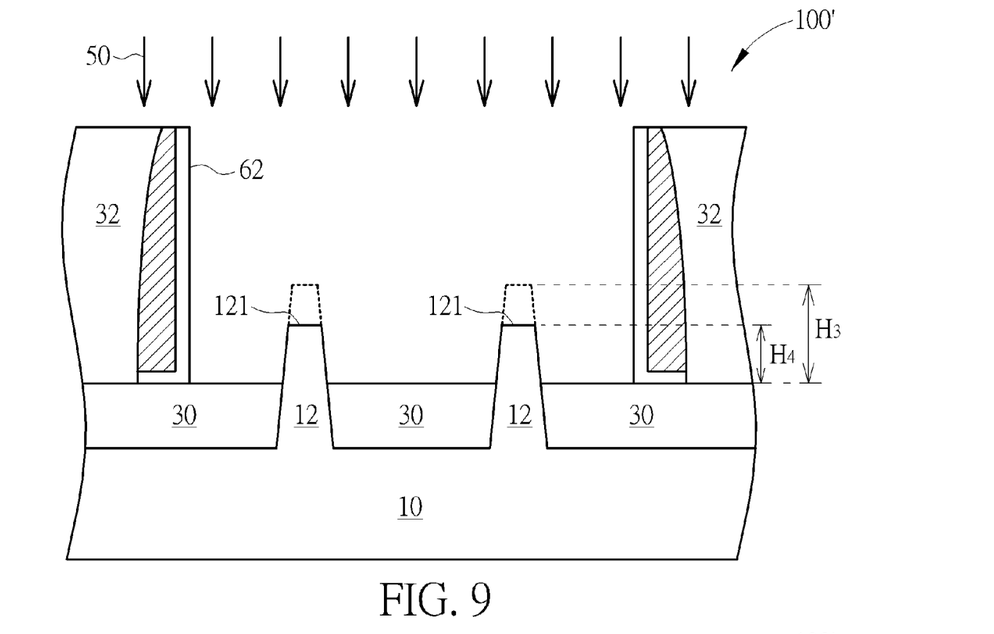

The dummy gate structure 60 is removed to leave a gate trench in the dielectric layer 32. In this way, the fin structure 13 may be exposed by the gate trench. FIG. 9 is a schematic diagram showing the semi-finished semiconductor device after the step of etching the fin structure. After the removal of the dummy gate structure 60, an etching process 50 is carried out to etch the fin structure 13 in the gate trench 62. During the etching process 50, the top surface 121 of the fin structure 13 may be reduced from the initial height $H_3$ to the reduced height $H_4$. Preferably, the ratio of the reduced height $H_4$ to the initial height $H_3$ is greater than 0.5.

Figure 10:
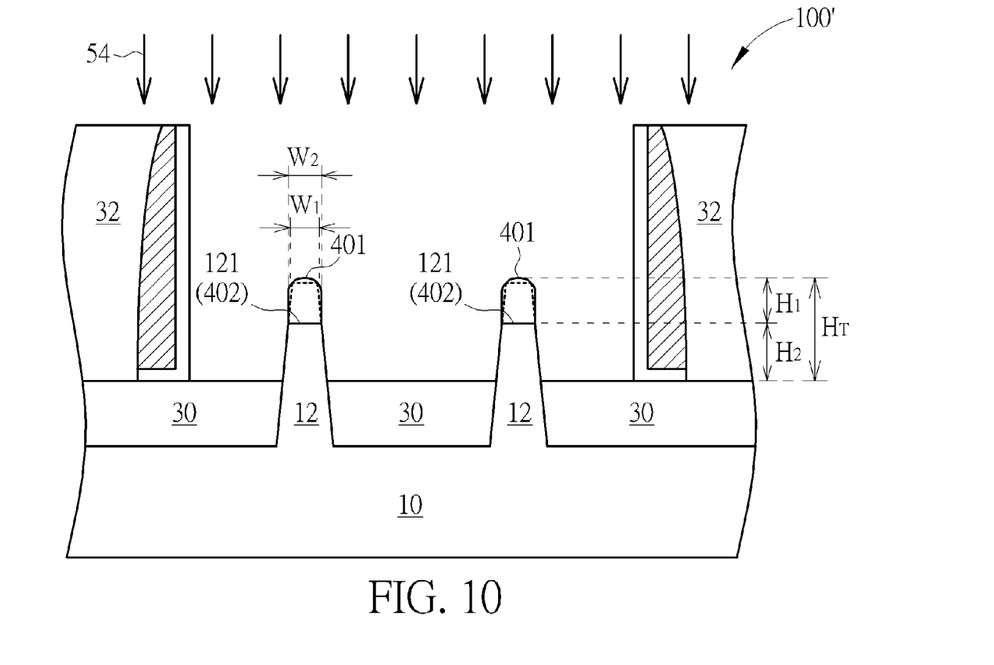

FIG. 10 is a schematic cross-sectional diagram showing the semi-finished semiconductor device after the step of performing an epitaxial growth process. An epitaxial growth process 54 such as a molecular beam epitaxial growth process, a co-flow epitaxial growth process, a cyclic selective epitaxial growth process and/or other suitable epitaxial growth processes may be carried out to grow epitaxial structures 40 on the top surface 121 of the fin structure 13. A flat interface 402 exists between the epitaxial structure 40 and the fin structure 13. According to this embodiment, similar to the previous first embodiment, because the top surface 121 of the fin structure 13 has a specific crystal surface (for example, a (100) crystal surface), the epitaxial structure 40 may grow faster on the top surface 121 than on the sidewall of the fin structure. If etchants capable of etching the epitaxial structure are intermittently applied to the chamber during the epitaxial growth process, these etchants may completely remove the epitaxial structure on the sidewall of the fin structures. In this way, only the epitaxial structure on the top surface of the fin structure remains when the epitaxial growth process is completed. Preferably, the width of the epitaxial structure 40 is gradually reduced from bottom to top, which causes the epitaxial structure 40 to have a curved top surface 401. In detail, the middle region of the epitaxial structure 40 may have a width $W_2$ wider than the width $W_1$ of the middle region of the original fin structure (referring to the wedge-shaped dotted lines shown in FIG. 6). Therefore, the epitaxial structure 40 may provide a wider carrier channel than the original fin structure. In addition, the position of the apex of the top surface 401 may be used as a basis for determining the end point of the epitaxial growth process 54. For example, when the epitaxial growth process 54 is completed, the apex of the top surface 401 may be at an original height of the top surface of the fin structure prior to the etching process, and the apex of the top surface 401 may be at an initial height $H_3$ at this processing stage. In this way, the height $H_1$ of the epitaxial structure 40 itself may be less than the height $H_2$ of the fin structure 13. In a case where the fin structure 13 and epitaxial structure 40 have a total height $H_T$, the ratio of the height $H_1$ of the epitaxial structure 40 to the total height $H_T$ is preferably less than 0.5.

The remaining replacement metal gate process may then be performed, and a metal gate structure similar to that shown in FIG. 2 may be formed in the gate trench 62 through this process. After the replacement metal gate process, an optional inter-metal dielectric layer, an optional self-aligned contact, and so forth may be further formed so as to obtain desired semiconductor device. These structures and processes are omitted for the sake of clarity.

The preceding first and second embodiments disclose methods for fabricating semiconductor devices; however, the present invention also includes other methods for fabricating semiconductor devices. In the following paragraphs, a third embodiment which incorporates the first embodiment and the second embodiment is disclosed.

According to the third embodiment of the present invention, and taking the structure shown in FIG. 7, the epitaxial structure 40 may be disposed on the top surface of the fin structure 13. At this time, portions of the epitaxial structure 40 may be covered by the dummy gate structure 60 while the rest of the epitaxial structure 40 is exposed from the dummy gate structure 60 and covered by the dielectric layer 32.

Figure 11:
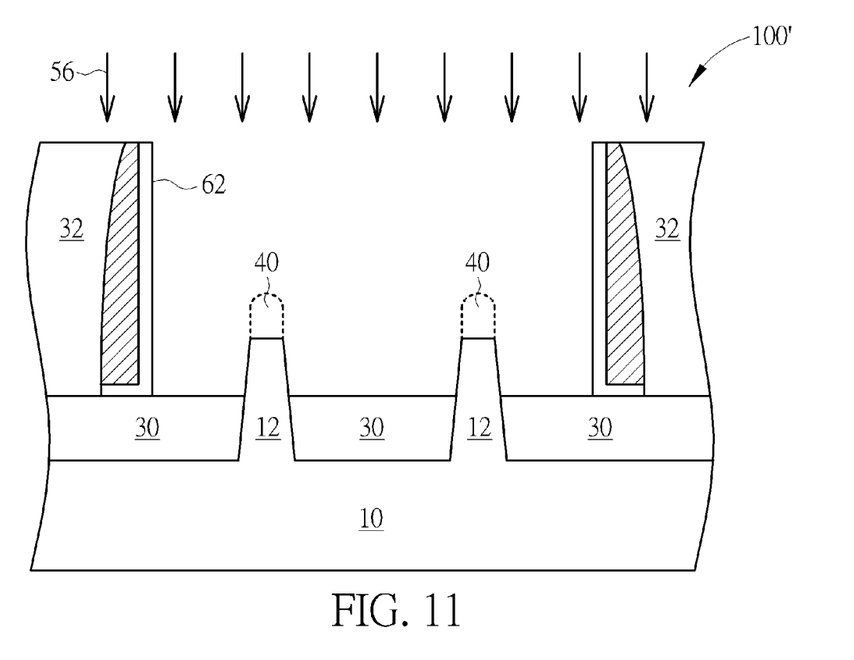
FIG. 11 is a cross-sectional diagram showing a method for fabricating a semiconductor device according to still another embodiment of the present invention.

Then, the dummy gate structure 60 is removed to leave a gate trench 62 in the dielectric layer 32. FIG. 11 is a schematic diagram showing the semi-finished semiconductor device after the step of etching the fin structure. After the removal of the dummy gate structure 60, an etching process 56 is carried out to etch the epitaxial structure 40 in the gate trench 62 to obtain the structure shown in FIG. 11. During the etching process 56, only the epitaxial structure in the gate trench 62 is removed while the epitaxial structure outside the epitaxial structure remains because it is covered by the dielectric layer 32.

As shown in FIG. 10, another epitaxial growth process 54 is carried out to form another epitaxial structure on the top surface 121 of the fin structure 13 exposed by the gate trench 62. As mentioned above, the present embodiment discloses successive steps which include: growing the epitaxial structure completely covering the fin structure, forming the dummy gate structure covering portions of the epitaxial structure, removing the epitaxial structure in the gate trench, and growing another epitaxial structure in the gate trench. Through these steps, the epitaxial structures respectively inside and outside the gate trench 62 may be made of different materials. For example, when the epitaxial structure is disposed in a P-type field effect transistor, both the epitaxial structures inside and outside the gate trench 62 may be made of silicon germanium ($Si_{1-x}Ge_x$, $X \leq 1$). The germanium concentration of the epitaxial structure in the gate trench may be less than the germanium concentration of the epitaxial structure outside the gate trench. The above concept may also be applied to the epitaxial structure disposed in an N-type field effect transistor. The semiconductor device with this structure may provide superior electrical properties.

The remaining replacement metal gate process may then be performed. After the replacement metal gate process, an optional inter-metal dielectric layer and an optional self-aligned contact etc. may be further formed to obtain the desired semiconductor device. These structures and processes are omitted for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a fin structure, disposed on a substrate;
    an insulating structure, disposed on the substrate;
    a protruding structure, in direct contact with the substrate and partially protruding from the insulating structure, wherein portions of the protruding structure protruding from the insulating structure is the fin structure;
    an epitaxial structure, disposed on a top surface of the fin structure and completely covering the top surface of the fin structure, wherein the epitaxial structure has a curved top surface, and a bottom surface of the epitaxial structure is disposed only on a top surface of the fin structure; and a gate structure, covering the fin structure and the epitaxial structure.

2. The semiconductor device according to claim 1, wherein the fin structure and the epitaxial structure have a total height, and a ratio of the height of the epitaxial structure to the total height is less than 0.5.

3. The semiconductor device according to claim 1, wherein the width of the epitaxial structure is gradually reduced from a location close to the fin structure to a location away from the fin structure.

4. The semiconductor device according to claim 1, wherein the top surface of the fin structure has a (100) crystal surface.

5. The semiconductor device according to claim 1, further comprising:

a source region and a drain region, respectively disposed in the epitaxial structure on two sides of the gate structure; and a plurality of metal contact structures, respectively electrically connected to the source region, the drain region, and the gate structure, wherein a main current path is generated in an upper portion of the epitaxial structure when a voltage is applied to the source region, the drain region, and/or the gate structure.

6. The semiconductor device according to claim 5, wherein a current density in the upper portion of the epitaxial structure is higher than a current density in a lower portion of the epitaxial structure.

7. A method for fabricating a semiconductor device, wherein the method is applied to a semi-finished semiconductor device comprising a substrate, a fin structure, and an insulating structure, wherein both the fin structure and the insulating structure are disposed on the substrate, the method comprising:

etching a top surface of the fin structure; and growing an epitaxial layer on the top surface of the fin structure after the step of etching the top surface of the fin structure, wherein the epitaxial layer has a curved top surface, and a bottom surface of the epitaxial structure is disposed only on the top surface of the fin structure.

8. The method according to claim 7, wherein the top surface of the fin structure is reduced from an initial height to a reduced height when the step of etching the top surface of the fin structure is completed.

9. The method according to claim 8, wherein the top surface of the epitaxial structure is at the initial height when the step of growing the epitaxial structure is completed.

10. The method according to claim 7, wherein the fin structure and the epitaxial structure have a total height, and a ratio of the height of the epitaxial structure to the total height is less than 0.5.

11. The method according to claim 7, further comprising performing a plasma treatment and a thermal treatment to round the epitaxial structure.

12. The method according to claim 7, further comprising forming a dummy gate structure covering the epitaxial structure and the fin structure after the step of growing the epitaxial structure.

13. The method according to claim 7, wherein the semi-finished semiconductor device further comprises a dummy gate structure covering the fin structure and disposed in a gate trench before the step of etching the top surface of the fin structure, the method further comprising:

removing the dummy gate structure until the fin structure is exposed from the gate trench: and forming a metal gate structure covering the epitaxial structure and the fin structure.

14. The semiconductor device of claim 1, wherein the epitaxial structure has a curved top surface.

15. The semiconductor device of claim 1, wherein the width of the epitaxial structure is gradually reduced from the bottom surface of the epitaxial structure to a top surface of the epitaxial structure.

16. The semiconductor device of claim 1, wherein the gate structure covers portions of the fin structure and portions of the epitaxial structure, and the epitaxial structure covered by the gate structure and the epitaxial structure exposed from the gate structure are made of different materials.

17. The semiconductor device of claim 1, wherein the bottom of the epitaxial structure is higher than the top of the insulating structure.

18. The method of claim 7, wherein the width of the epitaxial structure is gradually reduced from the bottom surface of the epitaxial structure to a top surface of the epitaxial structure.

19. The method of claim 7, wherein the bottom of the epitaxial structure is higher than the top of the insulating structure.

* * * * *